United States Patent

Yamamoto et al.

(10) Patent No.: US 10,151,327 B2
(45) Date of Patent: Dec. 11, 2018

(54) MOTOR DRIVE DEVICE HAVING FAN MAINTENANCE STRUCTURE WITH GOOD OPERABILITY

(71) Applicant: FANUC CORPORATION, Yamanashi (JP)

(72) Inventors: Kazuhiro Yamamoto, Yamanashi (JP); Makoto Takeshita, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 87 days.

(21) Appl. No.: 15/603,811

(22) Filed: May 24, 2017

(65) Prior Publication Data

US 2017/0343013 A1 Nov. 30, 2017

(30) Foreign Application Priority Data

May 31, 2016 (JP) ................. 2016-109036

(51) Int. Cl.
| | |
|---|---|
| *F04D 29/60* | (2006.01) |
| *F28D 21/00* | (2006.01) |
| *H05K 7/20* | (2006.01) |
| *H02K 11/33* | (2016.01) |
| *H02K 9/04* | (2006.01) |

(52) U.S. Cl.
CPC ........... *F04D 29/602* (2013.01); *F28D 21/00* (2013.01); *H02K 11/33* (2016.01); *H05K 7/20918* (2013.01); *F28D 2021/0029* (2013.01); *H02K 9/04* (2013.01)

(58) Field of Classification Search
CPC .......... H02K 11/33; H02K 9/04; F28D 21/00; F28D 2021/0029; H05K 7/20918

USPC ............... 415/213.1; 361/695, 678
See application file for complete search history.

(56) References Cited

U.S. PATENT DOCUMENTS

| | | | |
|---|---|---|---|
| 2004/0212960 A1 | 10/2004 | Shih | |
| 2007/0058341 A1* | 3/2007 | Hsiao | G06F 1/20 |
| | | | 361/695 |

FOREIGN PATENT DOCUMENTS

| | | |
|---|---|---|
| JP | H07-307585 A | 11/1995 |
| JP | 4734299 B2 | 7/2011 |
| JP | 2011-259556 A | 12/2011 |
| JP | 2012-104653 A | 5/2012 |

OTHER PUBLICATIONS

An Office Action mailed by the Japanese Patent Office dated Mar. 27, 2018, which corresponds to Japanese Patent Application No. 2016-109036 and is related to U.S. Appl. No. 15/603,811.

* cited by examiner

*Primary Examiner* — Aaron R Eastman
(74) *Attorney, Agent, or Firm* — Studebaker & Brackett PC

(57) ABSTRACT

A motor drive device that closes a mounting hole for mounting a fan unit by way of a fan fixing member is provided with a structure that can effectively improve operability for maintenance. A bar serving as a regulating member of a motor drive device has a first projecting piece that is formed so as to curve downwards after extending in the horizontal direction from a top part thereof, and a second projecting piece that projects downwards from a bottom part thereof, and by the first projecting piece being placed in an upper insertion part and the second projecting piece being placed in a lower insertion part, a fan unit is fixed in a mounting hole of a flange.

5 Claims, 17 Drawing Sheets

MOTOR DRIVE DEVICE HAVING FAN MAINTENANCE STRUCTURE WITH GOOD OPERABILITY

This application is based on and claims the benefit of priority from Japanese Patent Application No. 2016-109036, filed on 31 May 2016, the content of which is incorporated herein by reference.

BACKGROUND OF THE INVENTION

Field of the Invention

The present invention relates to a motor drive device equipped with a fan unit.

Related Art

A heat sink for heat dissipation is installed to a motor drive device mounted on a power panel. Furthermore, a fan motor is installed to the heat sink, and enhances the cooling effect. The fan motor used in a machine tool is used in an environment in which cutting oil mist and fine particles are whirling, whereby the lifespan thereof may decline by use over a long period; therefore, it is necessary to replace and inspect periodically. Then, the fan motor for heat-sink cooling of a motor drive device is commonly positioned on the back surface side of the power panel. However, the back surface side of a power panel is often adjacent to a wall or the like, and accessing the fan motor of a motor drive device from the back surface side of the power panel is difficult in reality. For that reason, in the conventional technology, it has been necessary to remove the motor drive device from the power panel in order to replace or inspect the fan motor. In the case of removing the motor drive device from the power panel in this way, not only are the working hours extended, but there is a possibility of a wiring mistake occurring when re-installing the motor drive device to the power panel. Patent Document 1 is a patent made by taking account of such a situation, and relates to a motor drive device that enables the fan motor to be replaces or inspected without removing the motor drive device from the power panel. Patent Document 1 describes, in relation to an inverter device (motor drive device), a structure which seals an opening of a flange by fixing a fixing member that fixes the fan unit to the flange which is installed to a control panel.

Patent Document 1: Japanese Patent No. 4734299

SUMMARY OF THE INVENTION

The power panel and interior of the motor drive device are preferably separated from the exterior. For example, with a motor drive device used in a location at which performing cutting, there is concern over inviting damage to the power element inside the motor drive device or the electrical components on the printed board, if air containing cutting fluid (cutting fluid mist) penetrates to the interior of the power panel. In this regard, Patent Document 1 prevents the infiltration of foreign substances or dirty air to the interior by way of closing the opening of the flange by way of the fan fixing member. However, the fixing of the fan fixing member to the flange has been performed by fastening screws to a plurality of locations above and below the fan fixing member; therefore, it has been necessary to remove all of the screws at the plurality of locations above and below upon a maintenance operation on the fan unit. Depending on the case, work space is necessary for removing the screws using a tool such as a screw driver, and maintenance operation on the fan unit may also not be performed unless removing other components. In this way, there has been margin for improvement from the viewpoint of an increase in operability in the conventional technology.

The present invention has an object of providing a structure that can effectively raise operability for maintenance in a motor drive device which closes mounting holes for mounting a fan unit by way of a fan fixing member.

A first aspect of the present invention relates to a motor drive device (for example, the motor drive device 1 described later) including: a mounting member (for example, the flange 20 described later) in which a mounting hole (for example, the mounting hole 21 described later) is formed; a fan unit (for example, the fan unit 50 described later) having a fan (for example, the fan 51 described later) that can be arranged through the mounting hole, and a fan fixing member (for example, the fan fixing member 52 described later) that supports the fan; and a regulating member (for example, the fan unit hook 22 described later) that is disposed to the mounting member, and regulates movement of the fan fixing member in a direction distancing from the mounting hole, characterized in that the regulating member has a fixing member fitting part (for example, the fitting recess 25 described later) that fits with the fan fixing member, and a fastening member (for example, the screw 60 described later) is fastened to the mounting member in a state in which the fan fixing member is fitted to the fixing member fitting part, whereby the fan unit is fixed to the mounting member.

In addition, a second aspect of the present invention relates to a motor drive device (for example, the motor drive device 201 described later) including: a mounting member (for example, the flange 220 described later) in which a mounting hole (for example, the mounting hole 21 described later) is formed; a fan unit (for example, the fan unit 50 described later) having a fan (for example, the fan 51 described later) that can be arranged through the mounting hole, and a fan fixing member (for example, the fan fixing member 52 described later) that supports the fan; and a regulating member (for example, the slide member 230 described later 230) that is disposed to the mounting member, and regulates movement of the fan fixing member in a direction distancing from the mounting hole, characterized in that a regulating member fitting part (for example, the slide hook 222 described later) that fits with an end on one side of the regulating member is formed in the mounting member, and a fastening member (for example, the screw 60 described later) is fastened to the mounting member in a state in which the regulating member is fitted to the regulating member fitting part, whereby the fan unit is fixed to the mounting member.

Furthermore, a third aspect of the present invention relates to a motor drive device (for example, the motor drive device 301 described later) comprising: a mounting member (for example, the flange 320 described later) in which a mounting hole (for example, the mounting hole 21 described later) is formed; a fan unit (for example, the fan unit 50 described later) having a fan (for example, the fan 51 described later) that can be arranged through the mounting hole, and a fan fixing member (for example, the fan fixing member 52 described later) that supports the fan; and a regulating member (for example, the rotation member 330 described later) that is disposed to the mounting member, and regulates movement of the fan fixing member in a direction distancing from the mounting hole, characterized in that the regulating member is supported by the mounting member to be rotatable between a regulating position contacting the fan fixing member, and a distanced position distancing from the fan fixing member, and a fastening member (for example, the screw 60 described later) is fastened to the mounting member in a state in which the regulating member is at the regulating position, whereby the fan unit is fixed to the mounting member.

Moreover, a fourth aspect of the present invention relates to a motor drive device (for example, the motor drive device 401 described later) including: a mounting member (for example, the flange 420 described later) in which a mounting hole (for example, the mounting hole 21 described later) is formed; a fan unit (for example, the fan unit 50 described later) having a fan (for example, the fan 51 described later) that can be arranged through the mounting hole, and a fan fixing member (for example, the fan fixing member 52 described later) that supports the fan; and a regulating member (for example, the rotation member 430 described later) that is disposed to the mounting member, and regulates movement of the fan fixing member in a direction distancing from the mounting hole, characterized in that the regulating member is supported by the mounting member to be rotatable between a regulating position contacting the fan fixing member, and a distanced position distancing from the fan fixing member, and a fitting part (for example, the fitting part 435 described later) that fits with a top part of the mounting member is formed at an end on an opposite side to a side supported to be rotatable, and the fan unit is fixed to the mounting member by the fitting part fitting with a top part of the mounting member in a state in which the regulating member is at the regulating position.

In addition, a fifth aspect of the present invention relates to a motor drive device (for example, the motor drive device 501 described later) including: a mounting member (for example, the flange 520 described later) in which a mounting hole (for example, the mounting hole 21 described later) is formed; a fan unit (for example, the fan unit 50 described later) having a fan (for example, the fan 51 described later) that can be arranged through the mounting hole, and a fan fixing member (for example, the fan fixing member 52 described later) that supports the fan; and a regulating member (for example, the bar 530 described later) that is disposed to the mounting member, and regulates movement of the fan fixing member in a direction distancing from the mounting hole, characterized in that the mounting member includes: a first insertion part (for example, the upper insertion part 540 described later) that is disposed at a periphery of the mounting hole, and through which the regulating member can be inserted, and a second insertion part (for example, the lower insertion part 550 described later) that is disposed at a periphery of the mounting hole, and through which the regulating member can be inserted, and the fan unit is fixed to the mounting member by the regulating member being inserted in the second insertion part in a state penetrating the first insertion part.

Furthermore, a sixth aspect of the present invention relates to a motor drive device (for example, the motor drive device 601 described later) including: a mounting member (for example, the flange 520 described later) in which a mounting hole (for example, the mounting hole 21 described later) is formed; a fan unit (for example, the fan unit 50 described later) having a fan (for example, the fan 51 described later) that can be arranged through the mounting hole, and a fan fixing member (for example, the fan fixing member 52 described later) that supports the fan; and a regulating member (for example, the bar 630 described later) that is disposed to the mounting member, and regulates movement of the fan fixing member in a direction distancing from the mounting hole, characterized in that the mounting member includes: a first insertion part (for example, the upper insertion part 540 described later) that is disposed at a periphery of the mounting hole, and through which the regulating member can be inserted, and a second insertion part (for example, the lower insertion part 550 described later) that is disposed at a periphery of the mounting hole, and through which the regulating member can be inserted, the regulating member includes a first projecting piece (for example, the first projecting piece 631 described later) that can insert into the first insertion part, and a second projecting piece (for example, the second projecting piece 635 described later) that can insert into the second insertion part, and the fan unit is fixed to the mounting member by the first projecting piece being inserted into the first insertion part, and the second projecting piece being inserted into the second insertion part.

Moreover, a seventh aspect of the present invention relates to a motor drive device (for example, the motor drive device 701 described later) including: a mounting member (for example, the flange 720 described later) in which a mounting hole (for example, the mounting hole 21 described later) is formed; a fan unit (for example, the fan unit 750 described later) having a fan (for example, the fan 51 described later) that can be arranged through the mounting hole, and a fan fixing member (for example, the fan fixing member 752 described later) that supports the fan; and a regulating member (for example, the upper hook 710 and lower hook 730 described later) that is disposed to the mounting member, and regulates movement of the fan fixing member in a direction distancing from the mounting hole, characterized in that the fan fixing member includes: a cover (for example, the cover 753 described later) that blocks the mounting hole, and a fitting part (for example, the fitting part 760 described later) that is disposed at a periphery of the cover, and fits with the regulating member.

According to an eighth aspect of the present invention, in the motor drive device as described in any one of the first to seventh aspects, the mounting member may be mounted at a position corresponding to an opening (for example, the opening 6 described later) formed in a panel (for example, the power panel 5 described later), and the mounting hole of the mounting member may communicate one side and another side of the panel.

According to a ninth aspect of the present invention, in the motor drive device as described in any one of the first to eighth aspects, the fan unit may be disposed at a cooling position to cool a heat sink (for example, the heat sink 12 described later) supported by the mounting member.

According to a tenth aspect of the present invention, in the motor drive device as described in any one of the first to ninth aspects, the fan fixing member of the fan unit blocks the mounting hole of the mounting member.

According to the present invention, it is possible to effectively raise operability for maintenance in a motor drive device which closes mounting holes for mounting a fan unit by way of a fan fixing member.

DETAILED DESCRIPTION OF THE INVENTION

Hereinafter, each preferred embodiment of the present invention will be explained while referencing the drawings.

Figure 1:
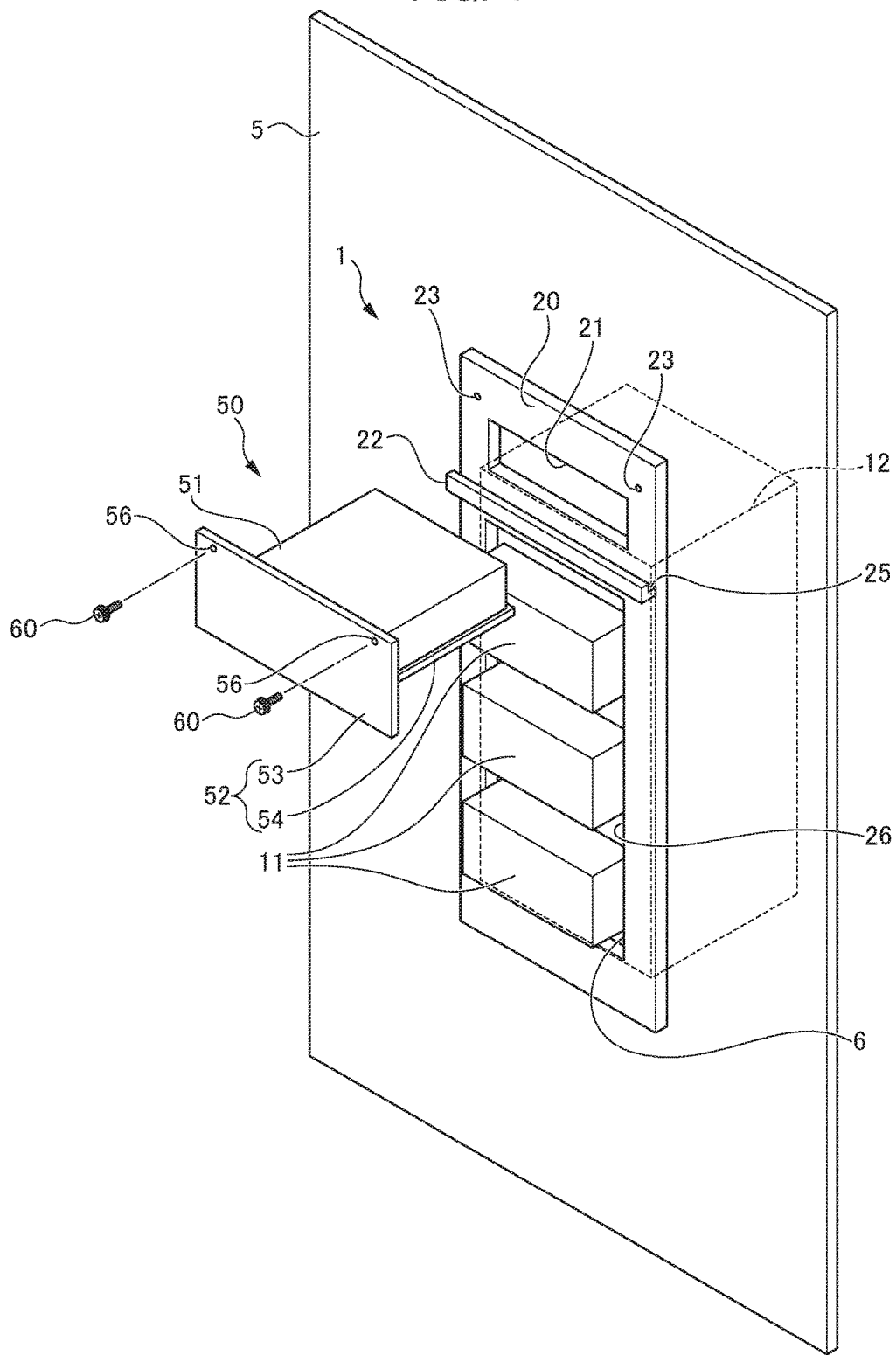
FIG. 1 is a perspective view of a motor drive device according to a first embodiment of the present invention showing a state in which a fan unit is removed from a flange of a motor drive device.
Figure 2:
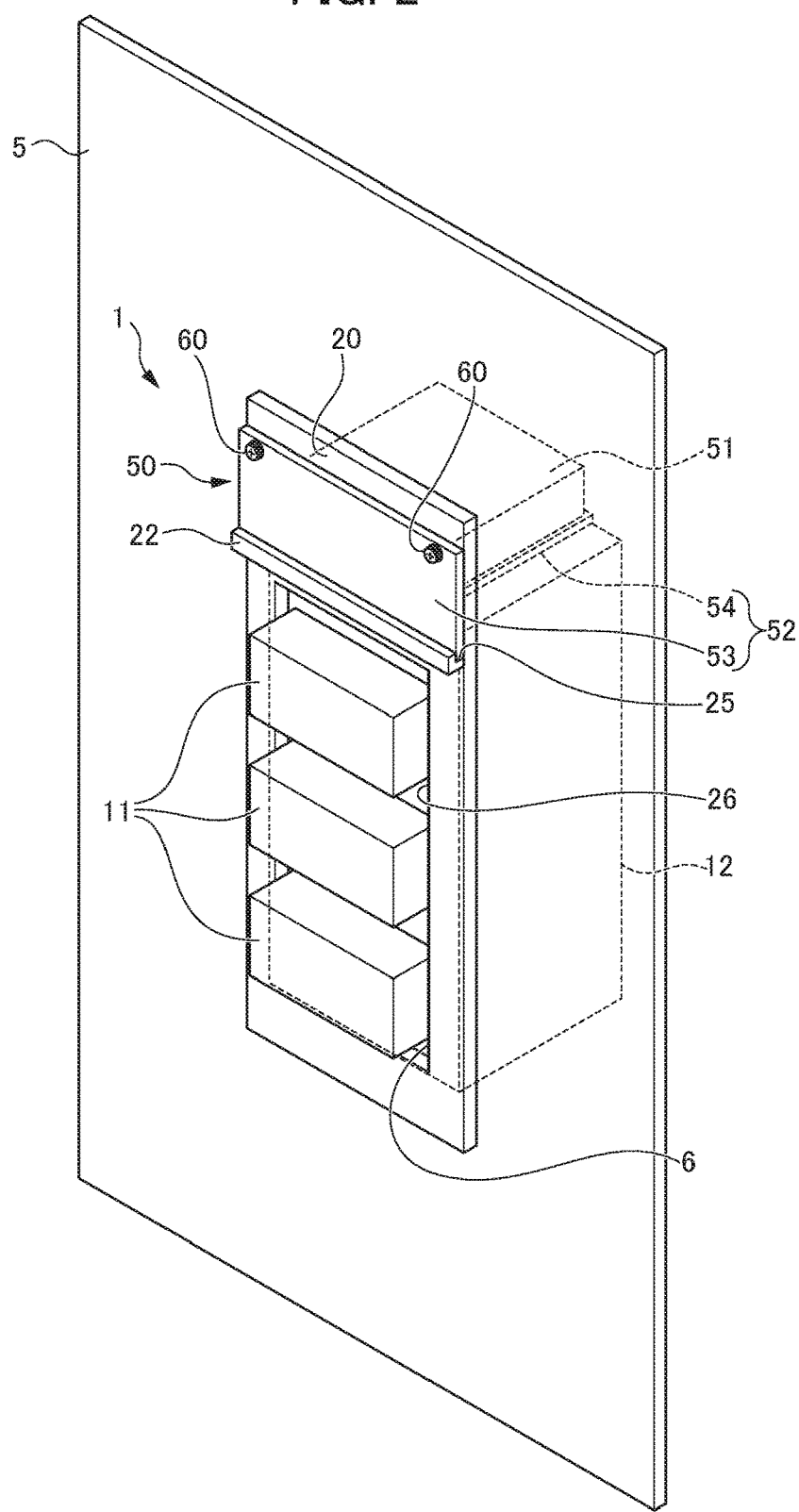
FIG. 2 is a perspective view of a motor drive device according to the first embodiment of the present invention showing a state in which a fan unit is mounted to the flange of the motor drive device.

FIG. 1 is a perspective view of a motor drive device 1 according to a first embodiment of the present invention, showing a state in which a fan unit 50 is removed from a flange 20. FIG. 2 is a perspective view of the motor drive device 1 according to the first embodiment of the present invention, showing a state in which the fan unit 50 is mounted to the flange 20. It should be noted that, in the drawings, an aspect viewing the state cutting off a part of a panel surface of a power panel 5 from an interior side is shown.

In the power panel 5, an opening 6 that is in communication with an external space on a back side thereof is formed, and the flange 20 is fixed to a position corresponding to this opening 6.

The flange 20 has a heat sink 12 coupled to a back face thereof. An opening 26 for retaining a power element 11 at the inside and a mounting hole 21 for mounting the fan unit 50 are formed in the flange 20. In the present embodiment, the heat sink 12 is fixed in a state contacted by a portion of the circumference of the opening 26 at the back face (surface on external side) of the flange 20. Then, the power element 11 is fixed to the surface (face on interior side) of the heat sink 12, and the power element 11 is positioned on an interior side of the power panel 5.

The mounting hole 21 to which the fan unit 50 is mounted is formed in a top part of the flange 20. The mounting hole 21 communicates the interior and exterior of the power panel 5. For the mounting hole 21 of the present embodiment, the position thereof becomes above the power element 11 and heat sink 12. In addition, screw holes 23 are formed in the corners on the upper side of the surface of the flange 20. The screw holes 23 are formed at a total of two locations at the upper right and upper left of the mounting hole 21 in a front view.

A fan unit hook 22 is provided below the mounting hole 21 in the surface of the flange 20, and above the power element 11. The fan unit hook 22 is a regulating member that regulates movement from the mounting hole 21 towards a distancing direction by locking the fan unit 50.

Figure 3:
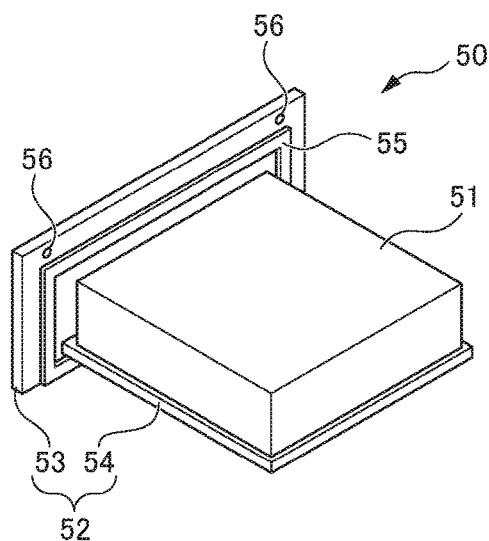
FIG. 3 is a perspective view of the fan unit of the first embodiment.

FIG. 3 is a perspective view of the fan unit 50 of the first embodiment. The fan unit 50 is configured to be detachable relative to the flange 20 mounted to the power panel 5. The fan unit 50 includes a fan 51, a fan fixing member 52, and packing 55 as principal configurations.

The fan 51 is a cooling device for cooling the heat sink 12. As shown in FIG. 2, the fan 51 is positioned at a cooling position to cool the heat sink 12 when the fan unit 50 is mounted to the mounting hole 21. The cooling position of the fan 51 of the present embodiment becomes above the heat sink 12.

The fan fixing member 52 functions as a support part that supports the fan 51, as well as functioning as a cover that blocks the mounting hole 21 of the flange 20. The fan fixing member 52 of the present embodiment includes a cover 53 that covers the mounting hole 21, and a support part 54 that extends in a horizontal direction from the back side of the cover 53 and supports the fan 51. In addition, an insertion holes 56 corresponding to the position of the screw holes 23 are formed at two locations in the cover 53.

The packing 55 is arranged at the surface on the outer side of the cover 53, and is an elastic member formed in a rectangular frame shape according to the shape of the mounting hole 21. When the fan unit 50 is mounted to the mounting hole 21, the packing 55 elastically deforms and the gap between the cover 53 and flange 20 is filled.

Figure 4:
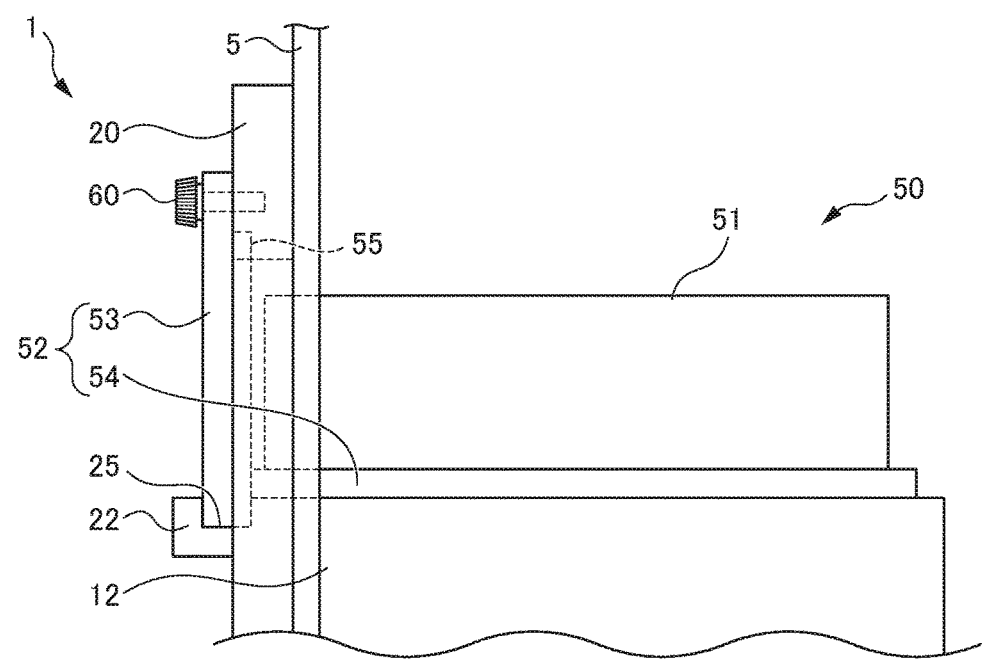
FIG. 4 is a side view showing a state in which the fan unit of the first embodiment is fixed to the flange of the motor drive device.

FIG. 4 is a side view showing a state in which the fan unit 50 of the first embodiment is fixed to the flange 20. The fan unit hook 22 is formed in an L-shape bending upwards, after protruding in the horizontal direction from the surface of the flange 20. A fitting recess 25 for fitting the fan unit 50 is formed by an L-shaped curved portion of the fan unit hook 22 and the surface of the flange 20.

Next, a step of mounting the fan unit 50 of the first embodiment to the mounting hole 21 will be explained. First, as shown in FIG. 1, a portion of the fan 51 of the fan unit 50 is placed into the mounting hole 21. Next, as shown in FIG. 4, a bottom end of the cover 53 is inserted into the fitting recess 25 of the fan unit hook 22, and the fan 51 is arranged at the cooling position. By the cover 53 inserting into the fitting recess 25 of the fan unit hook 22, the movement in a distancing direction from the mounting hole 21 of the fan unit 50 is regulated, and enters a state in which the fan unit 50 is retained in the mounting hole 21. In a state in which the fan unit 50 is retained in the mounting hole 21, the screws 60 pass through the insertion holes 56 at two locations and are threaded together with the screw holes 23 of the flange 20. A portion corresponding to the bottom side of the cover 53 is fixed to the fan unit hook 22 over the longitudinal direction, and a portion corresponding to the top side of the cover 53 is fixed by the screws 60 at two locations on both sides, whereby the fan unit 50 is fixed with good adhesion to the mounting hole 21. For maintenance operations, etc., when the fan unit 50 is removed from the flange 20, it is performed in the reverse order to the operation of mounting. In other words, the screws 60 are removed, the engaging between the cover 53 of the fan unit 50 and the fan unit hook 22 is released, and the fan unit 50 is drawn out from the mounting hole 21.

According to the motor drive device 1 of the first embodiment explained above, the following such effects are exerted. More specifically, the motor drive device 1 includes a flange 20 mounted at a position corresponding to the opening 6 formed in the power panel 5, and in which a mounting hole 21 is formed that is in communication with the back side (outer side) of the power panel 5, a heat sink 12 that is supported by the flange 20 at a back side of the power panel 5, a fan unit 50 having a fan 51 that can be arranged at a cooling position to cool the heat sink 12 on a back side of the power panel 5 through the mounting hole 21 and a fan fixing member 52 that supports the fan 51 at the cooling position and blocks the mounting hole 21, and a fan unit hook 22 that is arranged at the flange 20 and regulates movement of the fan fixing member 52 in a direction distancing from the mounting hole 21. The fan unit hook 22 has a fitting recess 25 that fits in a vertical direction with the fan fixing member 52, the insertion holes 56 for inserting screws 60 are formed in the fan fixing member 52, and the fan unit 50 is fixed to the flange 20 by the screws 60 being fastened to the flange 20 through the insertion holes 56 in a state in which the fan fixing member 52 fits in the fitting recess 25.

Since it is sufficient for the insertion holes 56 formed in the cover 53 to only be at the top part, it is thereby possible to shorten the length in the vertical direction of the cover 53 compared to a case of forming the insertion holes 56 above and below at two locations. In addition, since it is sufficient for the space at a front side of the flange 20 required in order to fasten the screws 60 by a screw driver to only be a portion in which the threaded holes 23 are formed, it is possible to raise the degrees of freedom in arrangement location and design. In addition, by supporting the bottom end of the cover 53 by the fan unit hook 22, the fan unit 50 is retained at the position thereof upon the position in the vertical direction of the fan unit 50 being decided; therefore, an operator can perform the fastening operation of the screw 60 using both hands. Compared the conventional technology which fixes the fan unit 50 to the flange 20 using only the screws 60, it is possible to reduce the number of screws 60, and thus shorten of the working hours consumed in the fastening operation can also be realized.

Next, another embodiment in which the structure mounting the fan unit to the flange differs from the first embodiment will be explained. It should be noted that, in the following explanation, the same reference symbols are assigned for configurations similar to configurations which have already been explained, and explanations thereof may be omitted.

Figure 5:
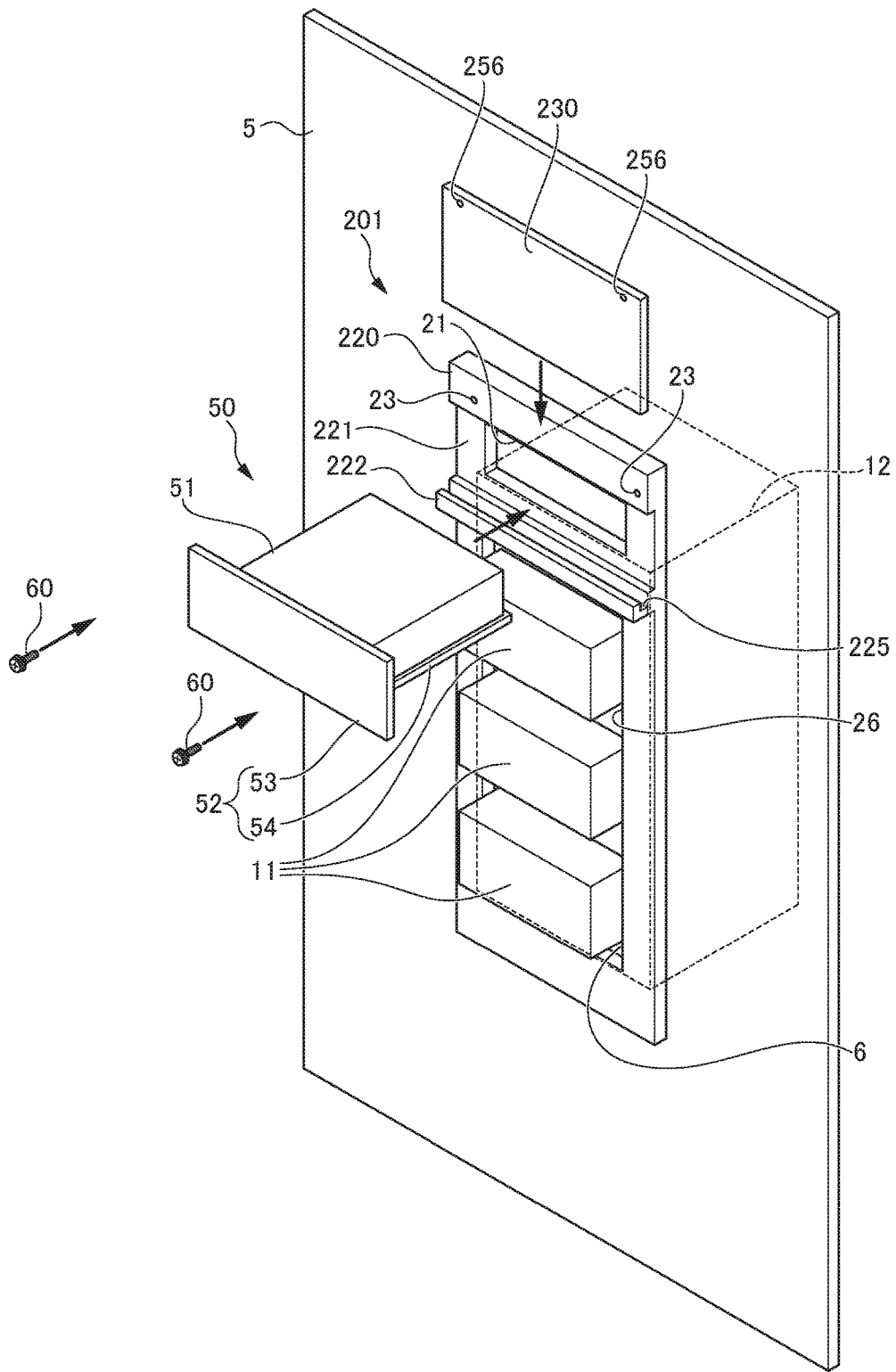
FIG. 5 is a perspective view of a motor drive device according to a second embodiment of the present invention showing a state in which a fan unit is removed from the flange of the motor drive device.
Figure 6:
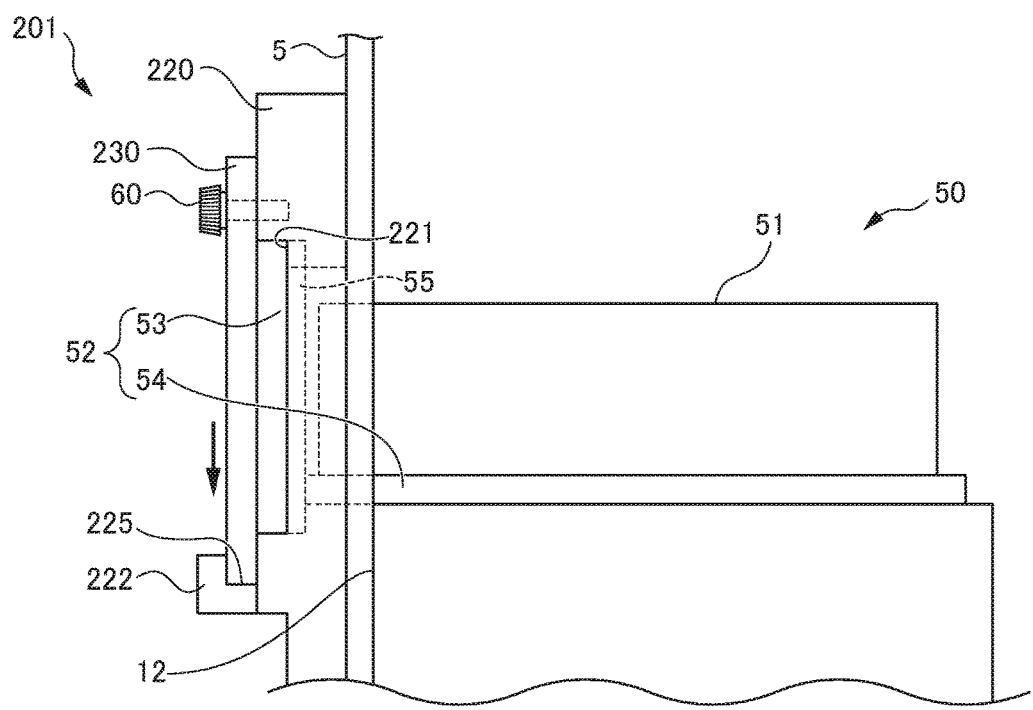
FIG. 6 is a side view showing a state in which the fan unit of the second embodiment is mounted to a flange of the motor drive device.

FIG. 5 is a perspective view of a motor drive device 201 according to a second embodiment of the present invention, showing a state in which the fan unit 50 is removed from a flange 220. FIG. 6 is a side view showing a state in which the fan unit 50 of the second embodiment is mounted to the flange 220.

As shown in FIG. 5, a flange recess 221 in which the cover 53 of the fan unit 50 is accommodated is formed in the flange 220 possessed by the motor drive device 201 of the second embodiment. The shape of the cover 53 of the fan unit 50 and the flange recess 221 correspond, and the mounting hole 21 enters a closed state by the cover 53 settling in the flange recess 221.

The motor drive device 201 of the second embodiment includes a slide member 230 for fixing the fan unit 50. The slide member 230 is a plate of laterally-long rectangular shape. An insertion hole 256 corresponding to the screw hole 23 of the flange 220 is formed in the corners on both upper sides of the surface of the slide member 230, respectively. It should be noted that the fan unit 50 of the second embodiment is a structure in which the insertion holes 56 that were formed in the cover 53 of the first embodiment are not formed in the cover 53, and the fan unit 50 is not directly fastened by the screws 60.

A slide hook 222 is provided below the recess flange 221 in the surface of the flange 220. The slide hook 222 is formed in an L shape that bends upwards, after projecting in the horizontal direction from the surface of the flange 20. A fitting recess 225 for fitting the slide member 230 is formed by the L-shaped curved portion of the slide hook 222 and the surface of the flange 220.

Next, the process of mounting the fan unit 50 of the second embodiment to the mounting hole 21 will be explained. First, as shown in FIG. 5, the portion of the fan 51 of the fan unit 50 is put into the mounting hole 21. The packing 55 also elastically deforms uniformly, without elastically deforming only the upper side or lower side, in the course of the fan unit 50 being inserted in the horizontal direction to the mounting hole 21, and the mounting hole 21 is blocked in a state keeping high sealability.

As shown in FIG. 6, by the cover 53 settling in the flange recess 221, the surface of the flange 220 and the surface of the cover 53 become substantially flush. In this state, the slide member 230 is put into the fitting recess 225 of the slide hook 22 from above. In a state putting the slide member 230 in the fitting recess 225, the screw 60 is screwed together with the screw hole 23 of the flange 220 through the insertion hole 256. The slide member 230 is thereby fixed at a position regulating the movement of the fan unit 50 in a direction distancing from the mounting hole 21 by the front of the flange 220. For maintenance operations, etc., when the fan unit 50 is removed from the flange 220, it is performed in the reverse order to the operation of mounting.

According to the motor drive device 201 of the second embodiment explained above, the following such effects are exerted. In other words, the motor drive device 201 further includes the slide member 230 that is arranged on the flange 220, and regulates the movement of the fan fixing member 52 in a direction distancing from the mounting hole 21. The slide hook 222 that fits in the end on one side of the slide member 23 is formed at the flange 220, and the slide member 230 is formed in a plate shape, as well as the insertion hole 256 through which the screw 60 is inserted being formed in the end on the opposite side to the side fitting with the slide hook 222. In a state in which the slide member 230 is fitting with the slide hook 222, the screw 60 is fastened to the flange 220 through the insertion hole 256, and the fan unit 50 is fixed to the flange 220.

Since the insertion hole 56 formed in the cover 53 is thereby no longer necessary, it is possible to shorten the length in the vertical direction of the cover 53 compared to the case of forming the insertion hole 56. In addition, since it is sufficient for the space on the front side of the flange 220 required in order to fasten the screws 60 by a screw driver to only be a portion in which the screw hole 23 are formed, it is possible to raise the degrees of freedom in arrangement locations and design. Since it is possible to fix the position of the fan unit 50 by the slide member 230 having the end on one side fitted in the slide hook 222, it is possible to decrease the number of screws 60 compared to the conventional technology which has fixed the fan unit 50 to the flange 20 using the screws 60, and thus shortening of the working hours consumed in the fastening operation can also be realized. In addition, in a configuration including the packing 55 as in the present embodiment, the fan unit 50 is inserted in the horizontal direction, and the fan unit 60 is pressed at the surface by the slide member 230 formed in a plate shape; therefore, it is possible to uniformly elastically deform the packing 55, and thus it is possible to further raise the sealability.

Figure 7:
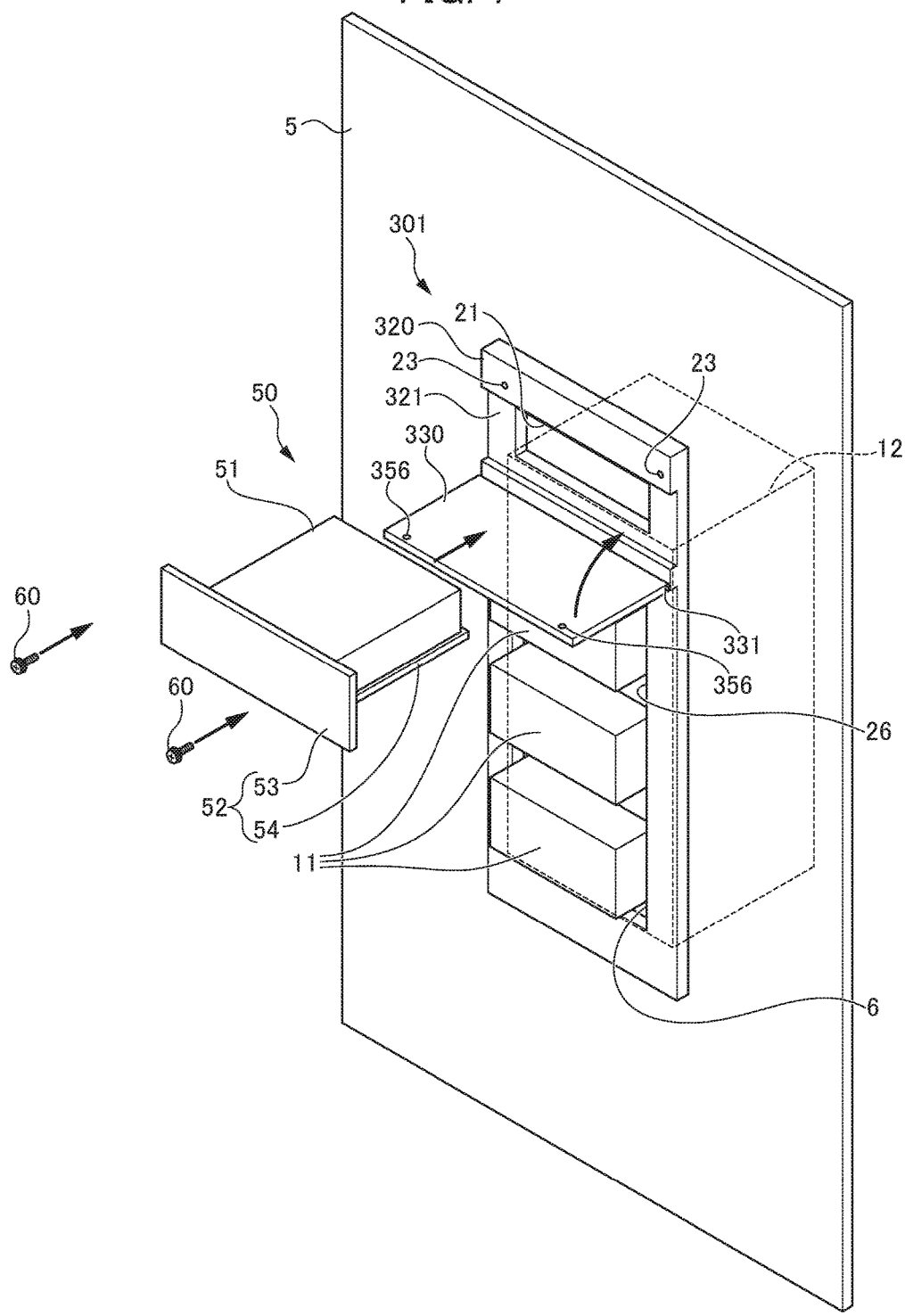
FIG. 7 is a perspective view of a motor drive device according to a third embodiment of the present invention showing a state in which a fan unit is removed from a flange of the motor drive device.
Figure 8:
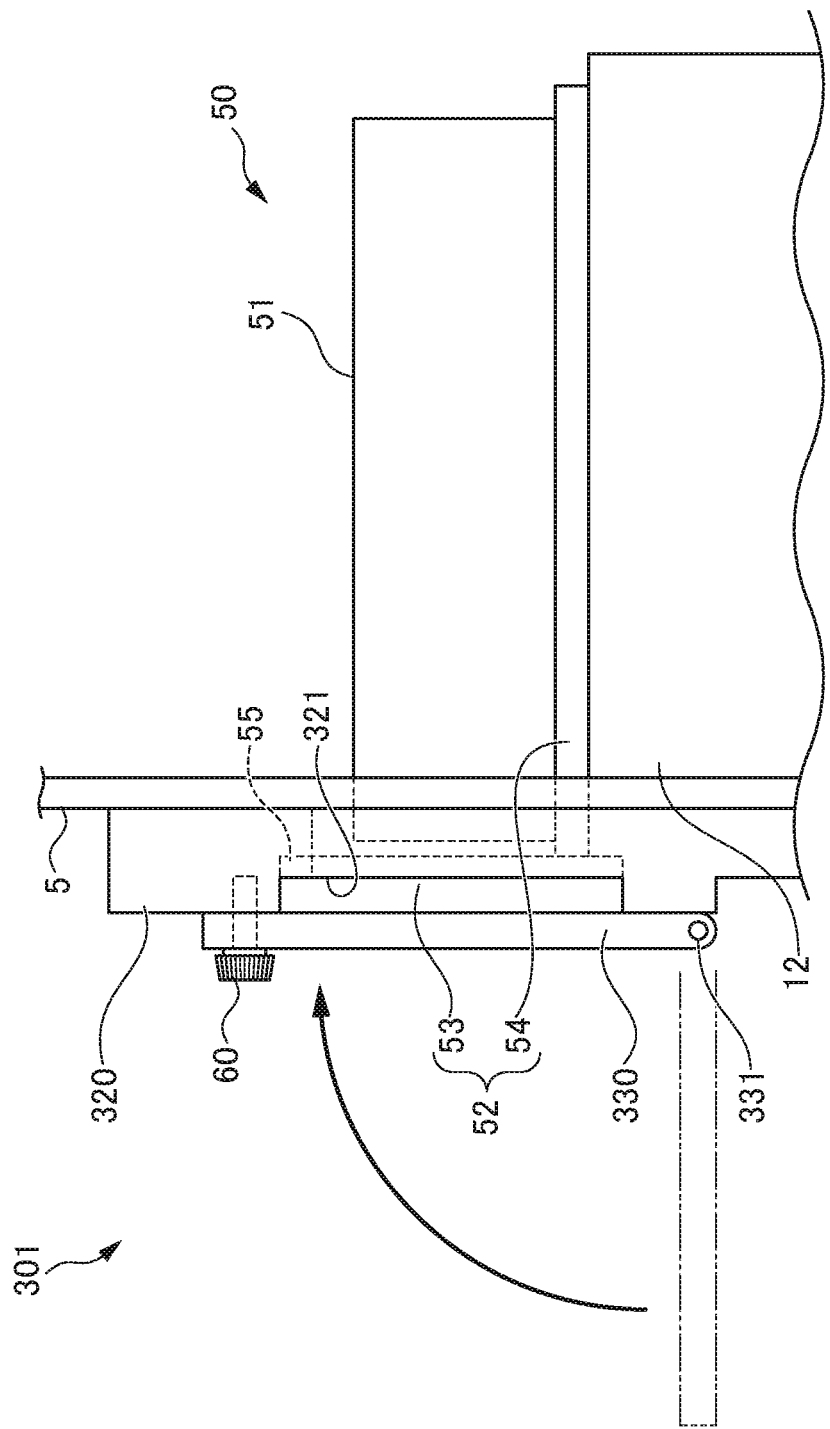
FIG. 8 is a side view showing a state in which the fan unit of the third embodiment is fixed to the flange of the motor drive device.

Next, a motor drive device 301 of a third embodiment will be explained. FIG. 7 is a perspective view of the motor drive device 301 according to the third embodiment of the present invention, showing a state in which the fan unit 50 is removed from a flange 320. FIG. 8 is a side view showing a state in which the fan unit 50 of the third embodiment is mounted to the flange 320.

As shown in FIG. 7, a flange recess 321 accommodating the cover 53 is formed in the flange 320, similarly to the second embodiment. A rotation member 330 serving as a regulating member that regulates the movement of the fan unit 50 in a direction distancing from the mounting hole 21 is arranged below the flange recess 321 in the surface of the flange 320.

The rotation member 330 is a plate of laterally-long rectangular shape, and an end on one side is supported by the flange 320 via a rotary shaft 331. In the present embodiment, the rotation member 330 is rotatably fitted to the rotary shaft 331 provided to the flange 320.

The rotation member 330 is configured to be rotatable between a distanced position when the fan unit 50 is removed from the mounting hole 21, and a regulated position when the fan unit 50 is mounted to the mounting hole 21. The distanced position of the rotation member 330 is set to a position at which not blocking the mounting hole 21, and not interfering with the insertion direction of the fan unit 50. For example, as shown in FIG. 7, the leading end of the rotation member 330 becomes rotatable until a state facing the horizontal direction. It should be noted that it is not limited to the state shown in FIG. 7, and it may configure a state in which the leading end of the rotation member 330 is facing down as the distanced position.

The regulated position is a position at which a planar portion on one side of the rotation member 330 opposes the surface of the cover 53. As shown in FIG. 8, a state in which the leading end of the rotation member 330 faces upwards is the regulated position. In addition, as shown in FIG. 7, insertion holes 356 corresponding to the positions of the screw holes 23 in the state that is the regulated position are formed at two locations in the rotation member 330.

Next, the process of mounting the fan unit 50 of the third embodiment to the mounting hole 21 will be explained. First, as shown in FIG. 7, a portion of the fan 51 of the fan unit 50 is put in the mounting hole 21. Next, as shown in FIG. 8, the rotation member 330 is made to rotate from the distanced position to the regulated position. The screws 60 are screwed into the screw holes 23 of the flange 220 through the insertion holes 356 in a state in which the rotation member 330 is at the regulated position. The rotation member 330 is thereby fixed at the regulated position regulating the movement of the fan unit 50 in a direction distancing from the mounting hole 21. For maintenance operations, etc., when the fan unit 50 is removed from the flange 320, it is performed in the reverse order to the operation of mounting.

According to the motor drive device 301 of the third embodiment explained above, the following such effects are exerted. Specifically, the rotation member 330 serving as the regulating member of the motor drive device 301 is supported by the flange 320 to be rotatable between the regulated position at which an end on one side contacts the fan fixing member 52, and a distanced position distancing from the fan fixing member 52, as well as the insertion holes 356 through which the screws 60 are inserted being formed in an end on an opposite side to the side rotatably supported In a state in which the rotation member 330 is at the regulated position, the screws 60 are fastened to the flange 320 through the insertion holes 356, and the fan unit 50 is fixed to the flange 320.

Since the insertion holes 56 formed in the cover 53 are thereby no longer necessary, it is possible to shorten the length in the vertical direction of the cover 53 compared to a case of forming the insertion holes 56. In addition, since it is sufficient for the space on the front side of the flange 320 required in order to fasten the screws 60 by a screw driver to only be a portion in which the screw holes 23 are formed, it is possible to raise the degrees of freedom in arrangement locations and design. Since it is possible to fix the position of the fan unit 50 by simply moving the rotation member 330 to the regulated position, it is possible to decrease the number of screws 60 compared to the conventional technology which has fixed the fan unit 50 to the flange 20 using the screws 60, and thus shortening of the working hours consumed in the fastening operation can also be realized. In addition, since the rotation member 330 is being mounted to the flange 320, there is no requirement to remove as a separate component, or concern over losing by dropping, and thus operability is good. In addition, in a configuration including the packing 55 as in the present embodiment, the fan unit 50 is inserted in the horizontal direction, and the fan unit 50 is pressed at the surface by the rotation member 330 formed in a plate shape; therefore, it is possible to uniformly elastically deform the packing 55, and thus it is possible to further raise the sealability.

Figure 9:
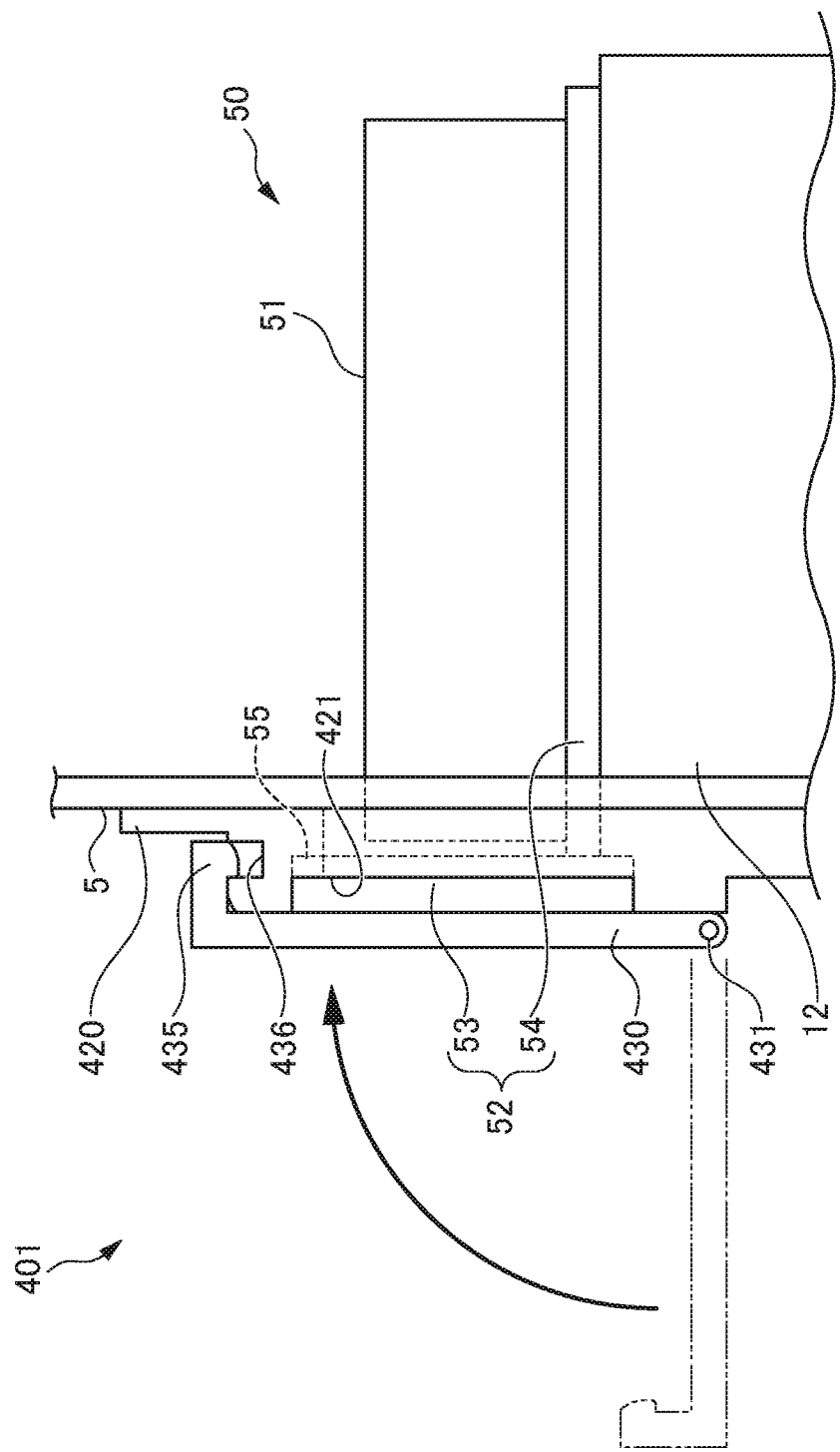
FIG. 9 is a side view showing a state in which a fan unit of a fourth embodiment is fixed to a flange of a motor drive device.

Next, a motor drive device 401 of the fourth embodiment will be explained. FIG. 9 is a side view showing a state in which the fan unit 50 of the fourth embodiment is fixed to a flange 420. As shown in FIG. 9, similarly to the third embodiment, in the fourth embodiment, a flange recess corresponding to the cover 53 is formed in the flange 420, as well as a rotation member 430 serving as a regulating member being fixed to the flange 420 via a rotary shaft 431 provided below the flange recess 421.

A hook-shaped fitting part 435 is formed at a leading end of the rotation member 430. In addition, a fitting recess 436 corresponding to the fitting part 435 of the rotation member 430 is formed in the upper face of the flange 420. By rotating the rotation member 430 until the regulated position in a state inserting the fan unit 50 in the mounting hole 21, and putting the leading end of the fitting part 435 of the rotation member 430 in the fitting recess 436, the fan unit 50 is fixed to the mounting hole 21. When performing a maintenance operation, after releasing fitting of the fitting part 435 and fitting recess 436, the rotation member 430 is made to move in the distancing direction and the fan unit 50 is drawn out from the mounting hole 21.

According to the motor drive device 401 of the fourth embodiment explained above, the following such effects are exerted. More specifically, the rotation member 430 serving as the regulating member of the motor drive device 401 is supported by the flange 420 to be rotatable between the regulating position contacting the fan fixing member 52 and the distancing position that distances from the fan fixing member 52, as well as the fitting part 435 that fits in the fitting recess 436 in the top part of the flange 420 being formed in the end on the opposite side to the side supported to be rotatable. The fitting part 435 fits in the fitting recess 436 in the top part of the flange 420 in a state in which the rotation member 430 is at the regulating position, whereby the fan unit 50 is fixed to the flange 420.

Since the insertion hole 56 formed in the cover 53 is no longer necessary, it is thereby possible to shorten the length in the vertical direction of the cover 53 compared to a case of forming the insertion hole 56. It is possible to fix the fan unit 50 by simply causing the rotation member 430 to move to the regulating position, and fitting the fitting part 435 in the flange 420, and it is not necessary to perform a fastening operation of the screws 60, and thus shortening of the working hours can also be realized. Moreover, in addition to the rotation member 430 being mounted to the flange 320, since the screws 60 are also not necessary, there is no requirement to remove as a separate component, or concern over losing by dropping, and thus operability is good. In addition, in a configuration including the packing 55 as in the present embodiment, the fan unit 50 is inserted in the horizontal direction, and the fan unit 50 is pressed at the surface by the rotation member 430 formed in a plate shape; therefore, it is possible to uniformly elastically deform the packing 55, and thus it is possible to further raise the sealability.

Figure 10:
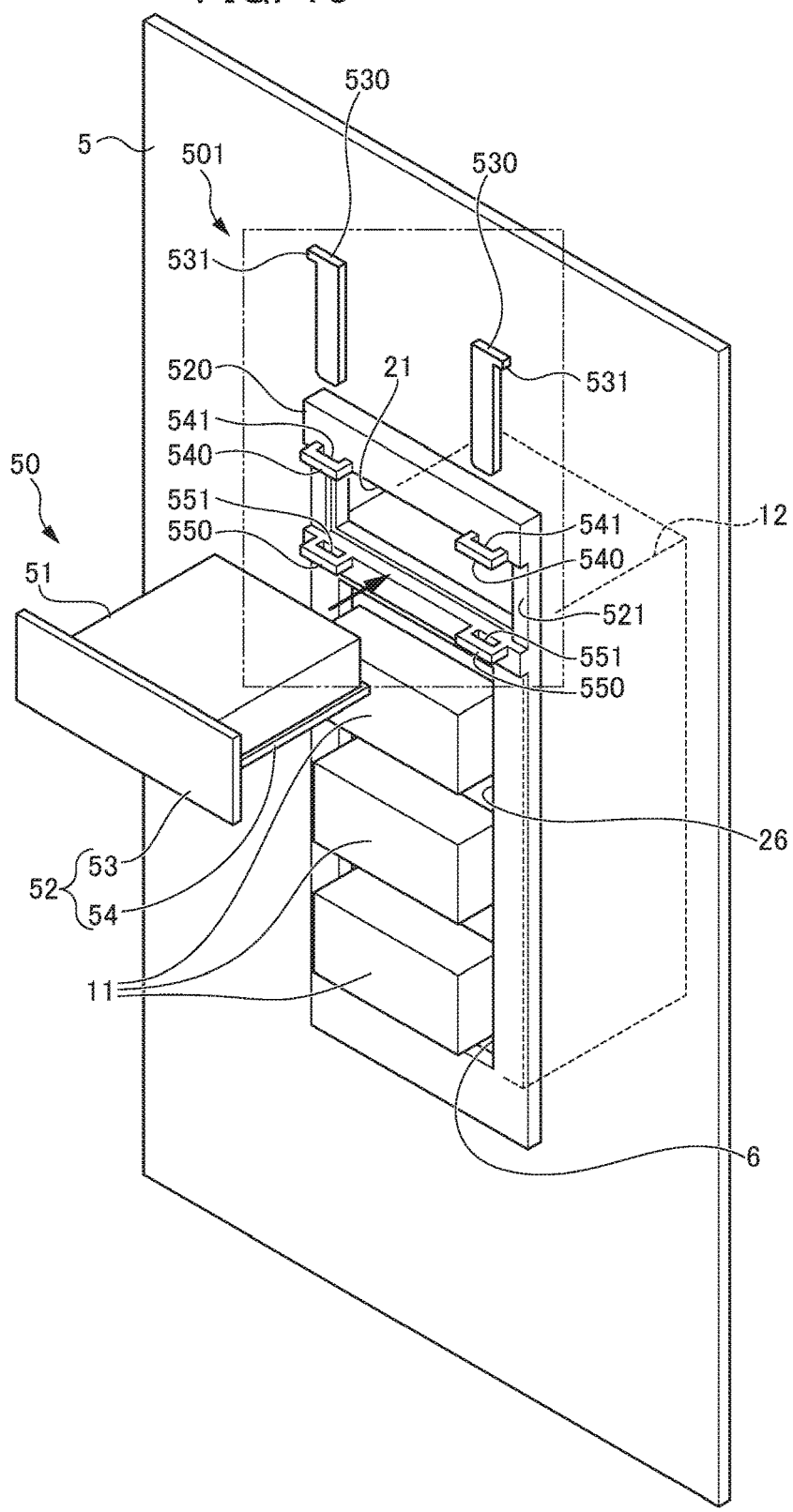
FIG. 10 is a perspective view of a motor drive device according to a fifth embodiment of the present invention in which a fan unit is removed from a flange of the motor drive device.
Figure 11:
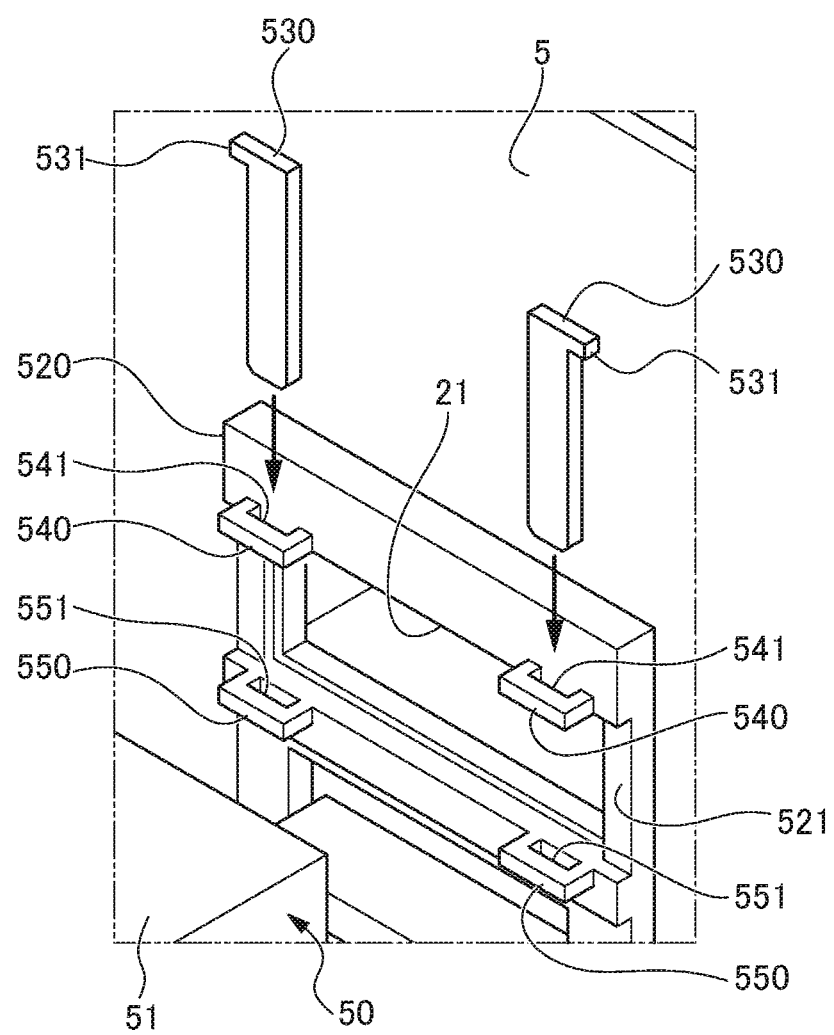
FIG. 11 is a perspective view showing principal parts of a structure fixing the fan unit of the fifth embodiment.
Figure 12:
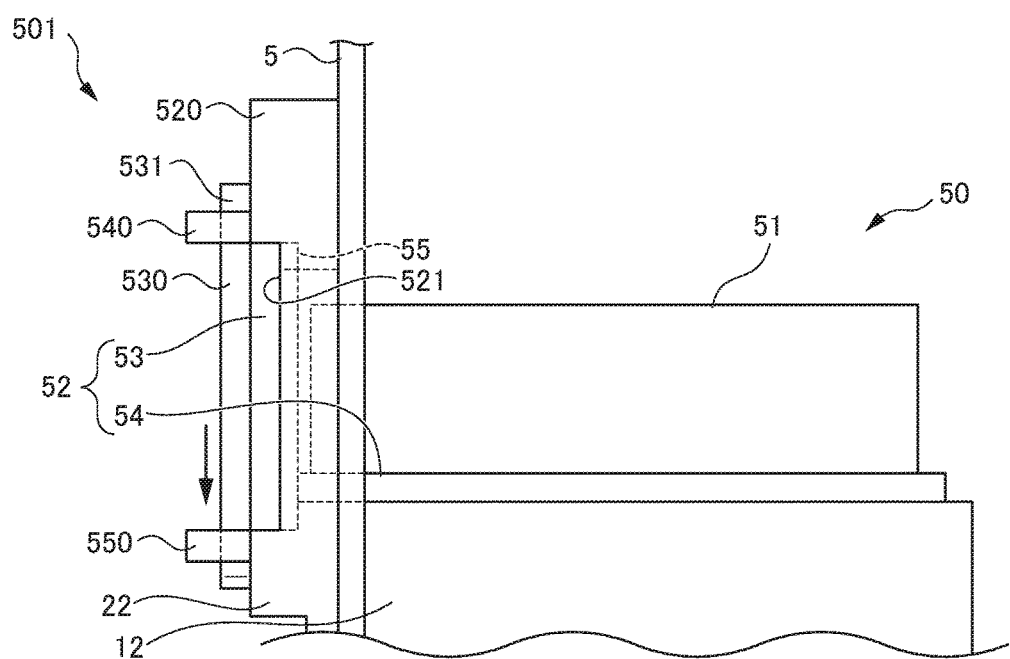
FIG. 12 is a side view showing a state in which the fan unit of the fifth embodiment is fixed to the flange of the motor drive device.

Next, a motor drive device 501 of a fifth embodiment will be explained. FIG. 10 is a perspective view of the motor drive device 501 according to the fifth embodiment of the present invention, showing a state in which the fan unit 50 is removed from a flange 520. FIG. 11 is a perspective view showing principal parts of a structure fixing the fan unit 50 of the fifth embodiment, and is a view enlarging the area indicated by the dotted line in FIG. 10. FIG. 12 is a side view showing a state in which the fan unit 50 of the fifth embodiment is fixed to the flange 520.

As shown in FIG. 11, a flange recess 521 corresponding to the cover 53 is formed in the flange 520. The mounting hole 21 is formed in the flange recess 521. As shown in FIG. 12, a plurality of upper insertion parts 540 is formed (two locations) to be spaced above the mounting hole 21. An insertion opening 541 into which a bar 530 serving as the regulating member can be inserted is formed in the upper insertion part 540. In addition, a plurality of lower insertion parts 550 are formed (two locations) at positions corresponding to the upper insertion holes 540, which are below the mounting hole 21.

In the fifth embodiment, two of the bars 530 serve as the regulating member, and fix the fan unit 50 to the flange 520. The bars 530 have locking parts 531 extending in the horizontal direction formed in a top part thereof. The bars 530 are retained at positions regulating movement of the fan unit 50 by this locking part 531 being locked to the upper insertion part 540.

In the process of mounting the fan unit 50 to the mounting hole 21, a portion of the fan 51 of the fan unit 50 is put in the mounting hole 21 to make the cover 53 in a state stored in the flange recess 521. Next, the bars 530 are put in the insertion openings 541 of the upper insertion parts 540. The lower end of the bar 530 penetrating the upper insertion hole 540 is inserted in an insertion opening 551 of the lower insertion part 550. The bar 530 is retained by the front face of the flange 520, without breaking through downward by the locking part 531. As shown in FIG. 12, the bar 530 is positioned at the front side of the fan unit 50, and regulates the motion of the fan fixing member 52 trying to distance from the mounting hole 21, to enter a state in which the fan unit 50 is fixed to the flange 520. For maintenance operations, etc., when the fan unit 50 is removed from the flange 520, it is performed in the reverse order to the operation of mounting.

According to the motor drive device 501 of the fifth embodiment explained above, the following such effects are exerted. The flange 520 of the motor drive device 501 is arranged above the circumference of the mounting hole 21, and has the upper insertion part 540 serving as a first insertion part into which the bar 530 serving as the regulating member can be inserted, and the lower insertion part 550 serving as a second insertion part arranged at a position corresponding to the position of the upper insertion part 540 below the circumference of the mounting hole 21. The bar 530 has the locking part 531 at the top part thereof that engages with the upper insertion part 540, and the fan unit 50 is fixed to the flange 520 by the bar 530 being inserted in the lower insertion part 550 in a state penetrating the upper insertion hole 540.

Since the insertion holes 56 formed in the cover 53 are thereby no longer necessary, it is possible to shorten the length in the vertical direction of the cover 53 compared to the case of forming the insertion holes 56. The fan unit 50 can be fixed by simply inserting the bars 530 into the upper insertion parts 540 and lower insertion parts 550, and it is not necessary to perform a fastening operation of the screws 60, and thus shortening of the working hours can also be realized. Operating space for fastening screws by way of a screw driver or the like is also not necessary, and thus it is possible to raise the degrees of freedom in arrangement and design. In addition, since the bar 530 will not be displaced unless pulling out the bar 530 of a latch structure in the opposite direction to the direction of gravity, stable fixing of the fan unit 50 can be realized. In addition, in a configuration including the packing 55 as in the present embodiment, the fan unit 50 is inserted in the horizontal direction, and the fan unit 50 is pressed by the plurality of bars 530 arranged at both left and right sides; therefore, it is possible to uniformly elastically deform the packing 55, and thus it is possible to further raise the sealability. It should be noted that, in the above-mentioned embodiment, the upper insertion parts 540 serving as the first insertion parts and the lower insertion parts 550 serving as the second insertion parts are arranged so as to align in the vertical direction interposing the mounting hole 21. It is sufficient so long as the first insertion part and second insertion part are arranged at the circumference of the mounting hole, and the configuration thereof can be modified as appropriate according to the situation such as a configuration in which the first insertion part and second insertion part align in the horizontal direction.

Figure 13:
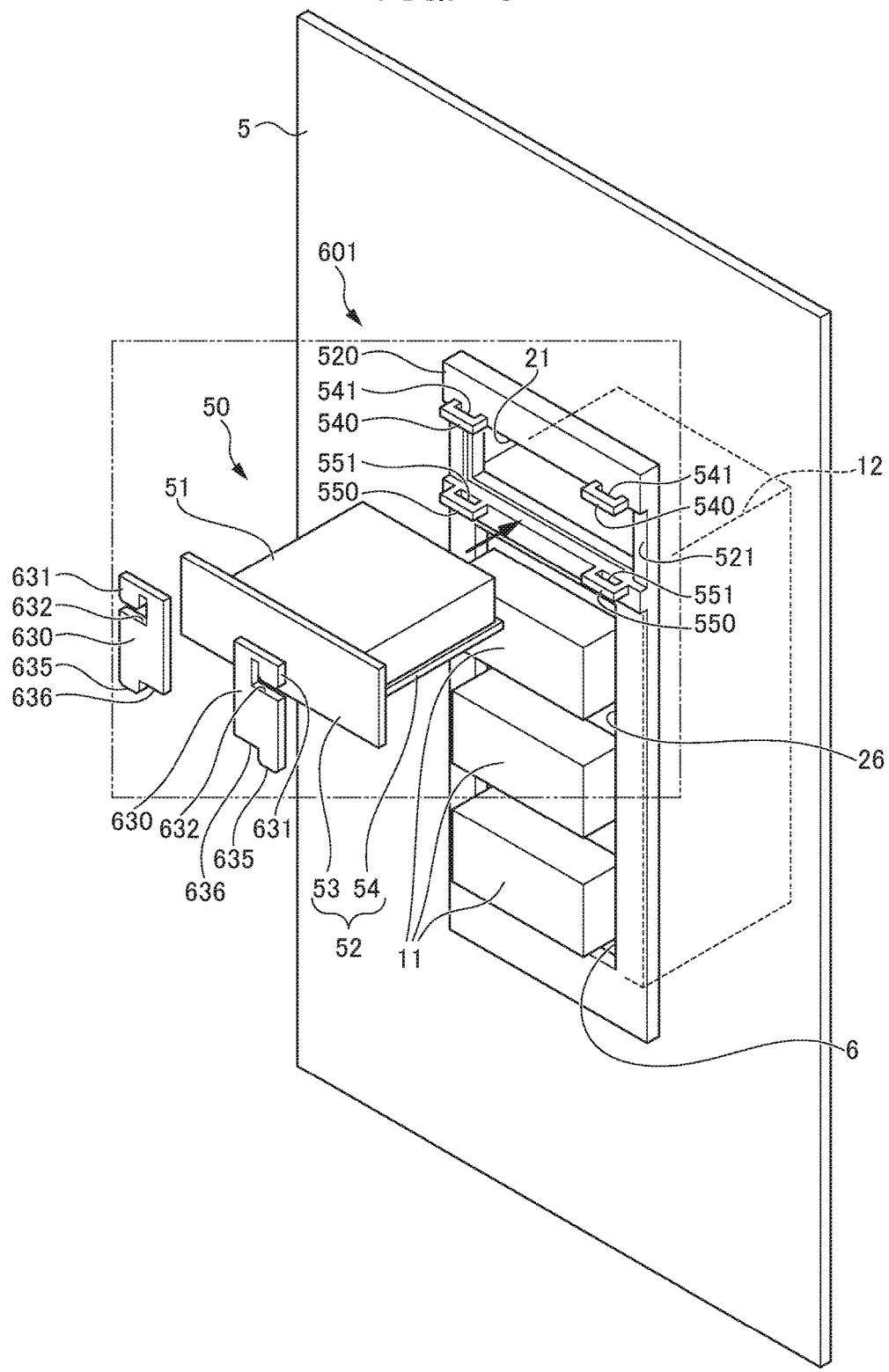
FIG. 13 is a perspective view of a motor drive device according to a sixth embodiment of the present invention showing a state in which a fan unit is removed from a flange of the motor drive device.
Figure 14:
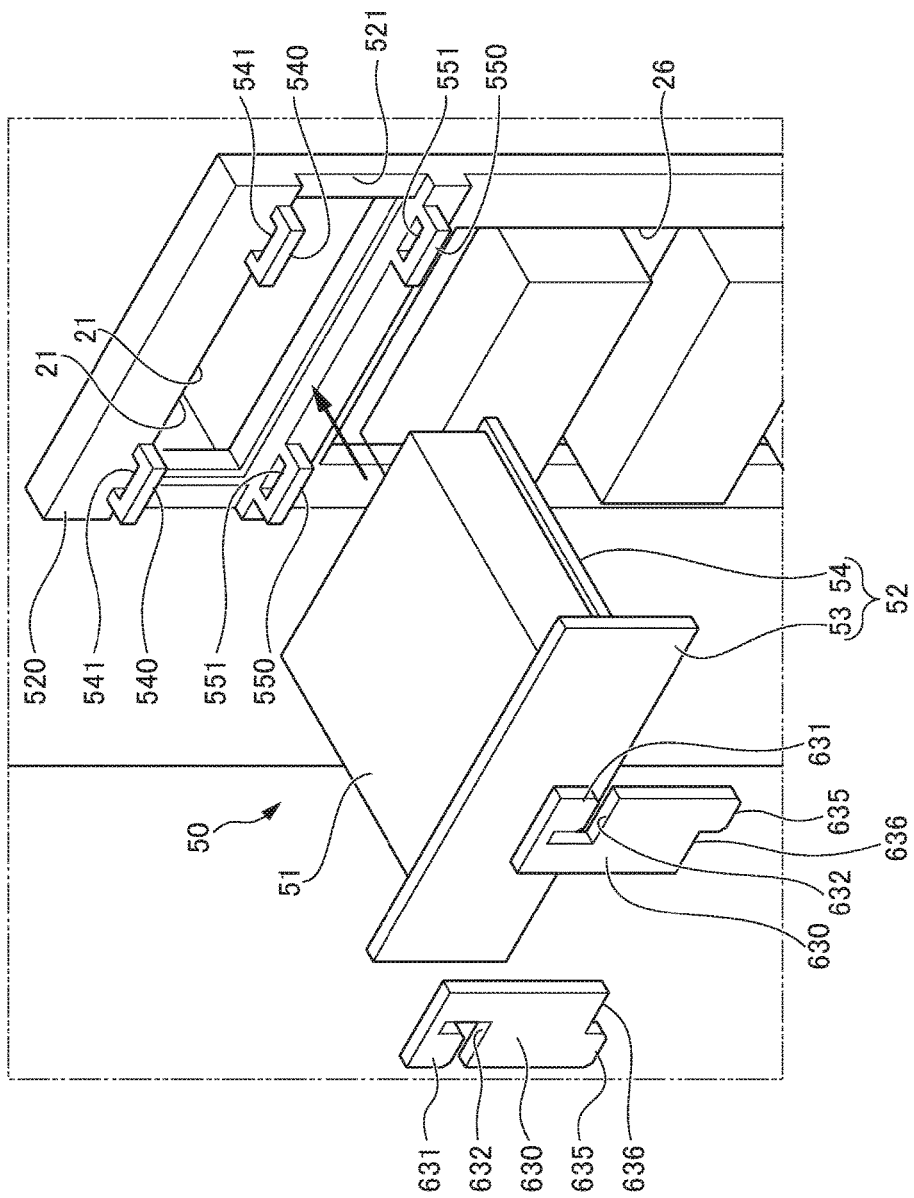
FIG. 14 is a perspective view showing principal parts of a structure fixing the fan unit of the sixth embodiment.
Figure 15:
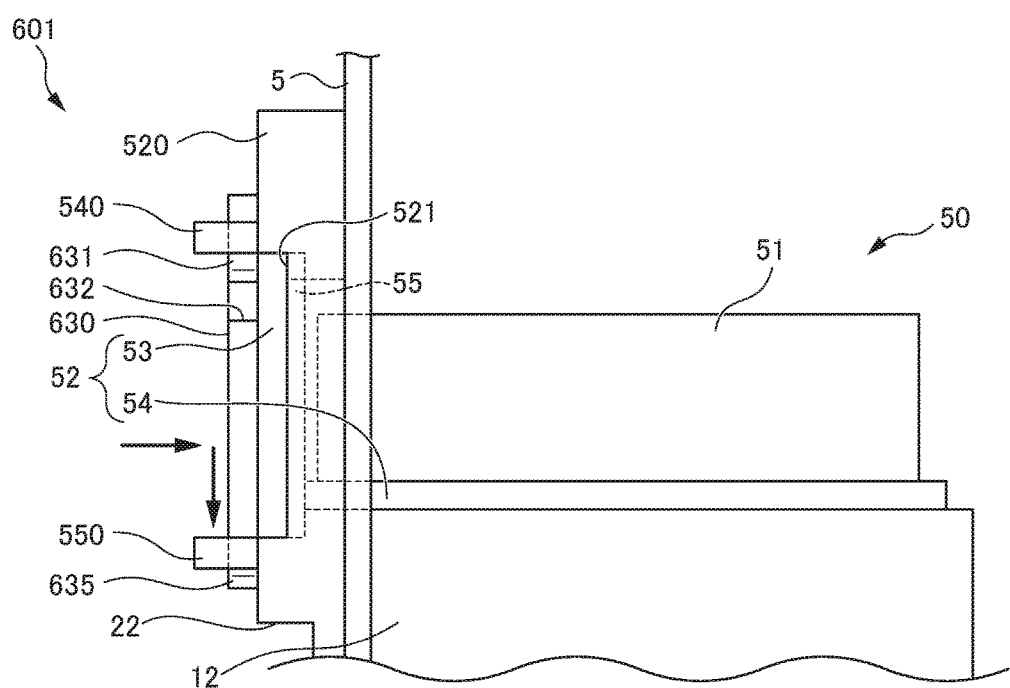
FIG. 15 is a side view showing a state in which the fan unit of the sixth embodiment is fixed to the flange of the motor drive device.
Figure 16:
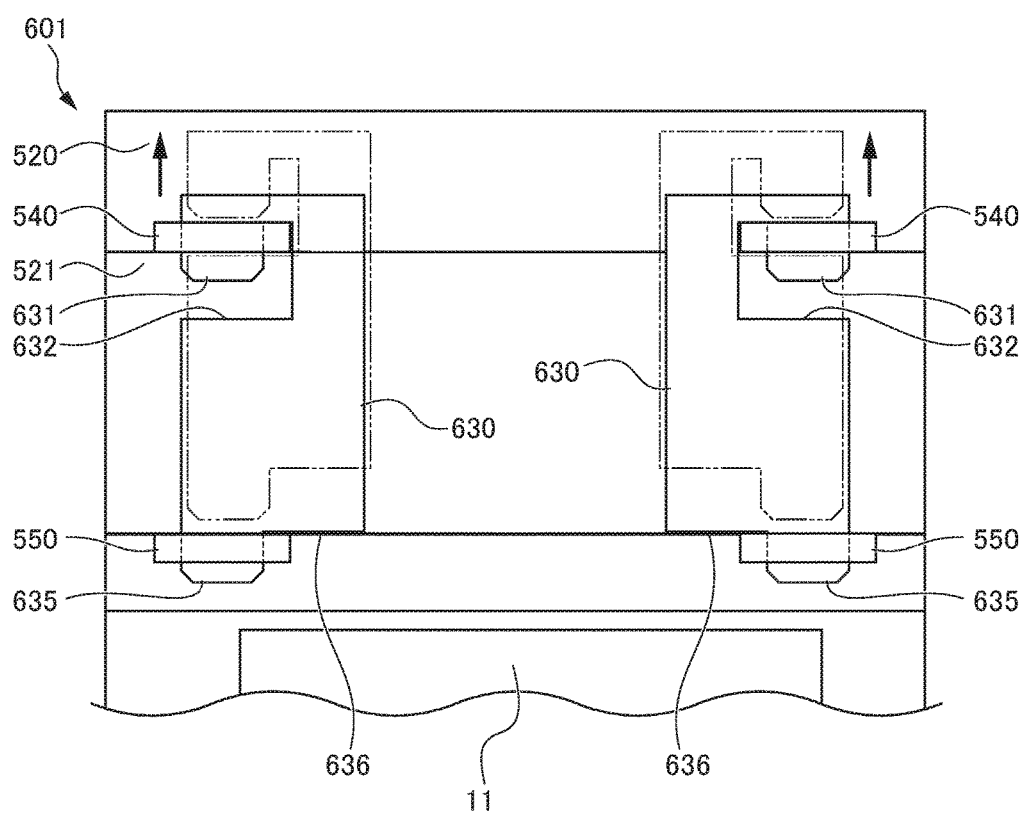
FIG. 16 is a front view showing principal parts of a structure fixing the fan unit of the sixth embodiment.

Next, a motor drive device 601 of a sixth embodiment will be explained. FIG. 13 is a perspective view of the motor drive device 601 according to the sixth embodiment of the present invention, showing a state in which the fan unit 50 is removed from the flange 520. FIG. 14 is a perspective view showing principal parts of a structure fixing the fan unit 50 of the sixth embodiment. FIG. 15 is a side view showing a state in which the fan unit 50 of the sixth embodiment is fixed to the flange 520. FIG. 16 is a front view showing principal parts of the structure fixing the fan unit 50 of the sixth embodiment.

As shown in FIGS. 13 to 16, a bar 630 of a shape differing from the bar 530 of the fifth embodiment is used as the regulating member in the sixth embodiment.

In the bar 630, an L-shaped upper notched part 632 is formed in a top part thereof, as well as a first projecting piece 631 to be put in the insertion opening 541 of the upper insertion part 540 being formed. The first projecting piece 631 is an edge part on an upper side of the L-shaped upper notched part 632, and is a shape projecting downwards. In addition, the upper notched part 632 has a width formed according to the thickness in the vertical direction of the upper insertion part 540, and makes it possible to cause the upper insertion part 540 to pass through in the horizontal direction.

The bar 630 has a lower notched part 636 formed in a bottom part thereof, as well as a second projecting piece 635 that projects downwards being formed. The second projecting piece 635 corresponds to the position of the first projecting piece 631, and is put in the insertion opening 551 of the lower insertion part 550. In a state in which the second projecting piece 635 is put into the insertion opening 551, a part of the lower notched part 636 contacts the upper face of the lower insertion part 550, whereby the bar 630 enters a state supported from below.

The bars 630 are respectively arranged at both left and right sides in a front view. In the present embodiment, the shapes of the left and right bars 630 are in a line symmetric relationship. As shown by the dotted line in FIG. 16, when drawing out the bar 630, the fitting of the upper insertion part 540 and lower insertion part 550 is released by simply slight raising upwards.

According to the motor drive device 601 of the sixth embodiment explained above, the following such effects are exerted. The bar 630 serving as the regulating member of the motor drive device 601 has the first projecting piece 631 formed so as to bend downwards after extending in the horizontal direction from the top part thereof and the second projecting piece 635 that projects from the bottom part downwards, and the fan unit 50 is fixed to the flange 520 by the first projecting piece 631 being put in the upper insertion part 540 and the second projecting piece 635 being put in the lower insertion part 550.

Since the insertion holes 56 formed in the cover 53 are thereby no longer necessary, it is possible to shorten the length in the vertical direction of the cover 53 compared to the case of forming the insertion holes 56. It is possible to fix the fan unit 50 by simply inserting the bars 630 into the upper insertion parts 540 and lower insertion parts 550, and it is not necessary to perform a fastening operation of the screws 60, and thus shortening of the working hours can also be realized. Operating space for fastening screws by way of a screw driver or the like is also not necessary, and thus it is possible to raise the degrees of freedom in arrangement and design. Since the bar 630 will not be displaced unless pulling out the bar 530 of a latch structure in the opposite direction to the direction of gravity, stable fixing of the fan unit 50 can be realized. In addition, it is possible to remove the bar 630 from the flange 520 by simply causing the bar 630 to move upwards by the insertion amount of the first projecting piece 631 and second projecting piece 635, when removing the bar 630. Since it is possible to remove the bar 630 by simply slightly lifting, it is possible to make the maintenance space above the flange 520 smaller. In addition, since the fan unit 50 in the present embodiment is inserted in the horizontal direction, it is possible to uniformly elastically deform the packing 55, and thus it is possible to further raise the sealability.

Figure 17:
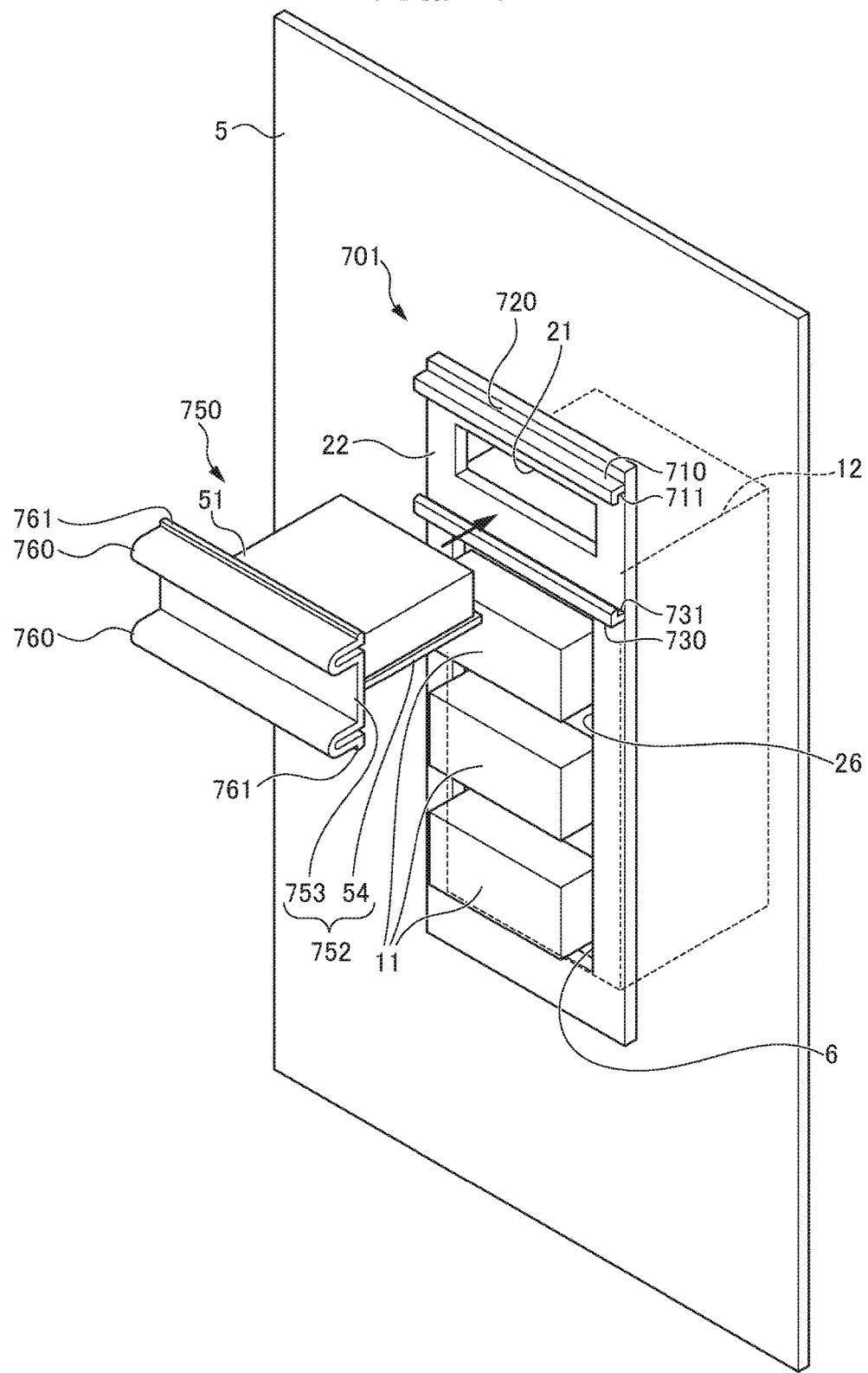
FIG. 17 is a perspective view of a motor drive device according to a seventh embodiment of the present invention showing a state in which a flange of the motor drive device is removed.
Figure 18:
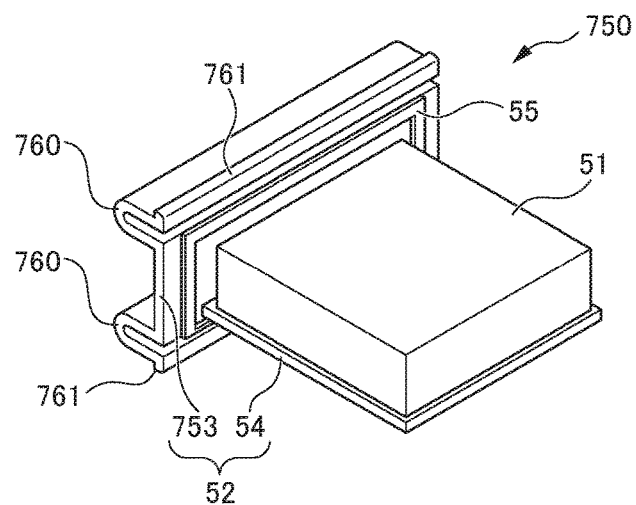
FIG. 18 is a perspective view of a fan unit of the seventh embodiment.
Figure 19:
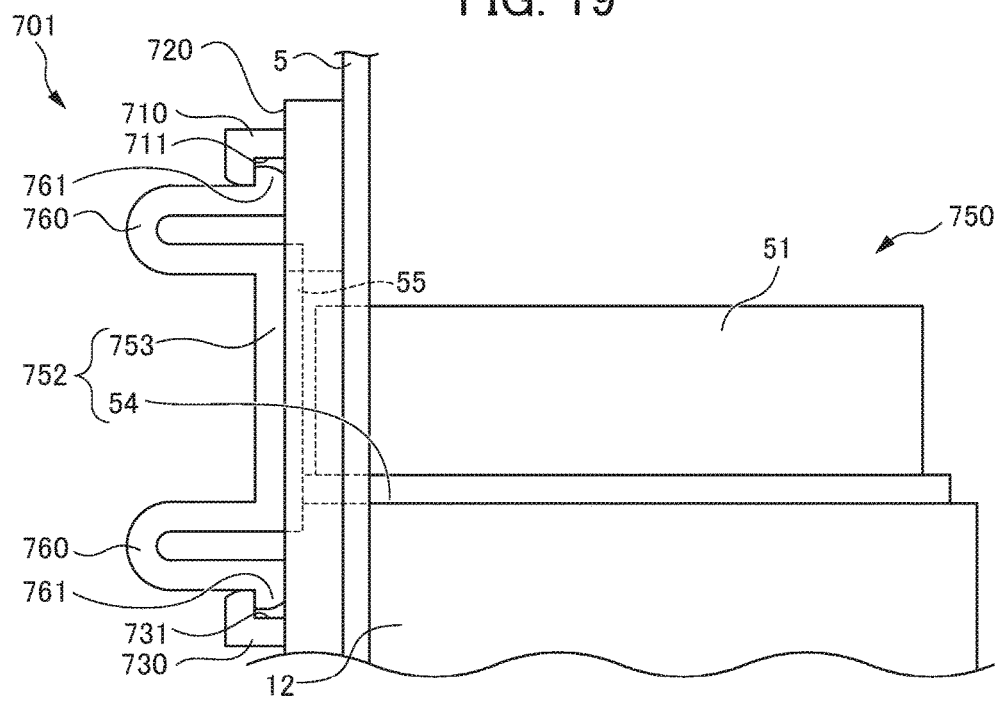
FIG. 19 is a side view showing a state in which a fan unit of the seventh embodiment is fixed to the flange of the motor drive device.

Next, a motor drive device 701 of a seventh embodiment will be explained. FIG. 17 is a perspective view of the motor drive device 701 according to the seventh embodiment of the present invention, showing a state in which the fan unit 50 is removed from a flange 720. FIG. 18 is a perspective view of the fan unit 750 of the seventh embodiment. FIG. 19 is a side view showing a state in which the fan unit 750 of the seventh embodiment is fixed to the flange 720.

As shown in FIG. 17, in the seventh embodiment, an upper hook 710 is arranged above the mounting hole 21 in the surface of the flange 720, and a lower hook 730 is arranged below the mounting hole 21.

As shown in FIG. 18, elastically deformable fitting parts 760 are formed above and below a cover 753 of a fan fixing member 752 of the seventh embodiment. A projecting part 761 that projects upwards is formed at an end of an upper fitting part 760, and a projecting part 761 that projects downwards is formed at an end of a lower fitting part 760.

As shown in FIG. 19, the upper hook 710 is formed in an L-shape that curves to a lower side after extending in the horizontal direction from the surface of the flange 720 in a side view. An upper fitting recess 711 is formed between this upper hook 710 and the surface of the flange 720. In addition, a lower hook 730 is formed in an L shape that curves to the upper side after extending in the horizontal direction from the surface of the flange 720, in a side view. A lower fitting recess 731 is formed between this lower hook 730 and the surface of the flange 720.

The fitting part 760 of the fan unit 750 is formed in a substantially U-shape turned sideways in a side view. By this fitting part 760 warping in the vertical direction, it enters a state in which the projecting part 761 of the upper fitting part 760 sticks into the upper fitting recess 711 of the upper hook 710, as well as the projecting part 761 of the lower fitting part 760 sticking into the lower fitting recess 731 of the lower hook 730. In this state, it is a state in which movement of the fan fixing member 752 to a direction distancing from the mounting hole 21 is regulated by the upper hook 710 and lower hook 730.

According to the motor drive device 701 of the seventh embodiment explained above, the following such effects are exerted. The fan fixing member 752 of the motor drive device 701 has the cover 753 that blocks the mounting hole 21, and the fitting parts 760 respectively arranged at an upper end and lower end of the cover 753, and configured to be elastically deformable. The regulating member which regulates the movement of the fan fixing member 752 in a direction distancing from the mounting hole 21 is configured from the upper hook 710 arranged above the mounting hole 21, and fitting in the upper fitting part 760, and the lower hook 730 arranged below the mounting hole 21 and fitting in the lower fitting hole 760.

Since the insertion holes 56 formed in the cover 53 are thereby no longer necessary, it is possible to shorten the length in the vertical direction of the cover 53 compared to the case of forming the insertion holes 56. It is possible to fix the fan unit 750 by simply causing the upper and lower fitting parts 760 of the cover 753 to fit in the upper hook 710 and lower hook 730, and it is not necessary to perform a fastening operation of the screws 60, and thus shortening of the working hours can also be realized. Operating space for fastening screws by way of a screw driver or the like is also not necessary, and thus it is possible to raise the degrees of freedom in arrangement and design. In addition, since the fan unit 750 is inserted in the horizontal direction also in the present embodiment, it is possible to uniformly elastically deform the packing 55, and thus it is possible to further raise the sealability.

Although preferred embodiments of the present invention have been explained above, the present invention is not to be limited to the aforementioned embodiments, and appropriate modifications are possible.

EXPLANATION OF REFERENCE NUMERALS

1, 201, 301, 401, 501, 601, 701 motor drive device
5 power panel (panel)
6 opening
12 heat sink
20, 220, 320, 420, 520, 720 flange (mounting member)
21 mounting hole
22 fan unit hook (regulating member)
25 fitting recess (fixing member fitting part)
50 fan unit
51 fan
52 fan fixing member
56 insertion hole
60 screw (fastening member)
222 slide hook (regulating member fitting part)
230 slide member (regulating member)
256 insertion hole
330 rotation member (regulating member)
356 insertion hole
430 rotation member (regulating member)
435 fitting part
530 bar (regulating member)
531 locking part
540 upper insertion part (first insertion part)
550 lower insertion part (second insertion part)
630 bar (regulating member)
631 first projecting piece
635 second projecting piece
710 upper hook (upper regulating member)
730 lower hook (lower regulating member)
750 fan unit
752 fan fixing member
760 fitting part

What is claimed is:
1. A motor drive device comprising:
a mounting member in which a mounting hole is formed;
a fan unit having a fan that can be arranged through the mounting hole, and a fan fixing member that supports the fan; and
a regulating member that is disposed to the mounting member, and regulates movement of the fan fixing member in a direction distancing from the mounting hole,
wherein the fan fixing member includes:
a cover that covers the mounting hole; and
a support part that extends in a horizontal direction from the back side of the cover and supports the fan,
wherein the mounting member includes:
a first insertion part that is disposed above the mounting hole, and through which the regulating member can be inserted, and
a second insertion part that is disposed in parallel with the first insertion part in a vertical direction below the mounting hole, and through which the regulating member can be inserted,
wherein a recess corresponding to the cover is formed, and the mounting hole is formed in the recess, and
wherein the fan unit is fixed to the mounting member by the regulating member, which is a bar in which a locking part that extends in a horizontal direction is formed in a top part thereof, being inserted into the second insertion part in a state penetrating the first insertion part, and being retained by a front face of the mounting member without breaking through downward by the locking part.

2. The motor drive device according to claim 1, wherein the mounting member is mounted at a position corresponding to an opening formed in a panel, and the mounting hole of the mounting member penetrates one side and another side of the panel.

3. The motor drive device according to claim 1, wherein the fan unit is disposed at a cooling position to cool a heat sink supported by the mounting member.

4. The motor drive device according to claim 1, wherein the fan fixing part of the fan unit blocks the mounting hole of the mounting member.

5. A motor drive device comprising:
a mounting member in which a mounting hole is formed;
a fan unit having a fan that can be arranged through the mounting hole, and a fan fixing member that supports the fan; and
a regulating member that is disposed to the mounting member, and regulates movement of the fan fixing member in a direction distancing from the mounting hole,
wherein the fan fixing member includes:
a cover that coves the mounting hole; and
a support part that extends in a horizontal direction from the back side of the cover and supports the fan,
wherein the mounting member includes:
a first insertion part that is disposed above the mounting hole, and through which the regulating member can be inserted, and
a second insertion part that is disposed below the mounting hole and in parallel with the first insertion part in a vertical direction, and through which the regulating member can be inserted,
wherein a recess corresponding to the cover is formed, and the mounting hole is formed in the recess, and
wherein the regulating member includes:
a first projecting piece, in which an L-shaped upper notched part is formed in a top part thereof, is an edge part on an upper side of the upper notched part, and is a shape projecting downwards that can insert into the first insertion part, and a second projecting piece, in which a lower notched part is formed in a bottom part thereof, that corresponds to a position of the first projecting piece, and can insert into the second insertion part, and wherein the fan unit is fixed to the mounting member by the first projecting piece being inserted into the first insertion part, and the second projecting piece being inserted into the second insertion part, thereby entering a state in which a part of the lower notched part contacts an upper face of the second insertion part, and supported from below to be retained by a front face of the mounting member.

\* \* \* \* \*